United States Patent
Harasaki

(10) Patent No.: US 11,513,534 B2
(45) Date of Patent: Nov. 29, 2022

(54) TRAVELING VEHICLE CONTROLLER AND TRAVELING VEHICLE SYSTEM

(71) Applicant: MURATA MACHINERY, LTD., Kyoto (JP)

(72) Inventor: Kazumi Harasaki, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 77 days.

(21) Appl. No.: 16/978,015

(22) PCT Filed: Jan. 30, 2019

(86) PCT No.: PCT/JP2019/003245
§ 371 (c)(1),
(2) Date: Sep. 3, 2020

(87) PCT Pub. No.: WO2019/176352
PCT Pub. Date: Sep. 19, 2019

(65) Prior Publication Data
US 2020/0409392 A1    Dec. 31, 2020

(30) Foreign Application Priority Data
Mar. 15, 2018  (JP) .............................. JP2018-048133

(51) Int. Cl.
*G05D 1/02* (2020.01)
*G01C 21/34* (2006.01)

(52) U.S. Cl.
CPC ....... *G05D 1/0291* (2013.01); *G01C 21/3407* (2013.01); *G05D 1/0212* (2013.01)

(58) Field of Classification Search
CPC ...... G05D 1/0291; G05D 1/0212; G05D 1/02; G05D 2201/0216; G01C 21/3407;
(Continued)

(56) References Cited

U.S. PATENT DOCUMENTS 10,579,073 B2 *   3/2020   Dembinski ........... B61L 25/025
2011/0178657 A1 *   7/2011   Harasaki .......... G05B 19/41895
                                                          701/2
(Continued)

FOREIGN PATENT DOCUMENTS

JP    5024193 B2    9/2012
JP    5278736 B2    9/2013

OTHER PUBLICATIONS

Official Communication issued in corresponding European Patent Application No. 19767304.9, dated Nov. 12, 2021.

*Primary Examiner* — Faris S Almatrahi
*Assistant Examiner* — Abdalla A Khaled
(74) *Attorney, Agent, or Firm* — Keating & Bennett, LLP

(57) ABSTRACT

A traveling vehicle controller includes a command assignment controller to detect a first-to-arrive traveling vehicle that is able to reach a destination point first among traveling vehicles, based on travel route candidates on which the traveling vehicles travel along a travel path from respective positions to reach the destination point, and assign the command to the first-to-arrive traveling vehicle. During detection of the first-to-arrive traveling vehicle, when a traveling vehicle traveling toward a branch point on the travel path is located within a range of a branch-switching impossible distance from the branch point and is scheduled to proceed toward a main way at the branch point, the command assignment controller performs pseudo-shift processing by which this traveling vehicle is determined to be located in a position downstream of the branch point and on a side of the main way.

10 Claims, 12 Drawing Sheets

(58) Field of Classification Search
CPC ... B65G 37/02; B65G 43/00; H01L 21/67276; H01L 21/67715; H01L 21/6773; H01L 21/67733; H01L 21/67724
See application file for complete search history.

(56) References Cited

U.S. PATENT DOCUMENTS

| | | | |
|---|---|---|---|
| 2012/0004767 A1* | 1/2012 | Tominaga | H01L 21/67769 700/230 |
| 2016/0232786 A1* | 8/2016 | Harasaki | B61L 23/00 |
| 2018/0162396 A1* | 6/2018 | Ibuka | G05D 1/0088 |
| 2020/0217684 A1* | 7/2020 | Okuyama | G05D 1/0212 |

* cited by examiner

TRAVELING VEHICLE CONTROLLER AND TRAVELING VEHICLE SYSTEM

BACKGROUND OF THE INVENTION

1. Field of the Invention

The present invention relates to a traveling vehicle controller and a traveling vehicle system.

2. Description of the Related Art

Conventionally, a traveling vehicle controller configured to assign, to any one of a plurality of traveling vehicles each configured to travel on a travel path including branch points, a command to travel to a destination point on the travel path has been known (see Japanese Patent No. 5278736, for example). In this traveling vehicle controller, the command is commonly assigned to a traveling vehicle that is closest to the destination point.

In the above-described traveling vehicle controller, when the command is assigned to a traveling vehicle that is approaching a branch point on the travel path, the traveling vehicle may fail to change courses toward the destination point at the branch point, and may detour to travel toward the destination point. Consequently, arrival of the traveling vehicle at the destination point may be late.

SUMMARY OF THE INVENTION

Preferred embodiments of the present invention provide traveling vehicle controllers and traveling vehicle systems that each enable a traveling vehicle to quickly reach a destination point.

A traveling vehicle controller according to a preferred embodiment of the present invention is a traveling vehicle controller to assign, to any one of a plurality of traveling vehicles that each travels on a travel path including a branch point, a command to travel to a destination point on the travel path. The traveling vehicle controller includes a command assignment controller to detect a first-to-arrive traveling vehicle that is able to reach the destination point first among the traveling vehicles, based on travel route candidates on which the traveling vehicles travel along the travel path from respective positions to reach the destination point, and assign the command to the first-to-arrive traveling vehicle. During detection of the first-to-arrive traveling vehicle, when one of the traveling vehicles traveling toward the branch point on the travel path is located within a range of a branch-switching impossible distance from the branch point and is scheduled to proceed toward a main way at the branch point, the command assignment controller performs pseudo-shift processing by which the one of the traveling vehicles is considered to be located in a position downstream of the branch point and on a side of the main way.

When courses of a traveling vehicle that is traveling are changed at the branch point, in order to switch a branch mechanism, for example, this traveling vehicle is located apart from the branch point with a distance longer than the branch-switching impossible distance. Thus, for a traveling vehicle that is traveling toward the branch point on the travel path and is located within the range of the branch-switching impossible distance from the branch point, it is difficult to change courses toward a branch way at the branch point (i.e., to travel along a post-course-switch travel route), and the traveling vehicle has to proceed toward the main way. Accordingly, by performing the pseudo-shift processing, the traveling vehicle controller determines the traveling vehicle to be located at a position downstream of the branch point and on the side of the main way. Consequently, a travel route on which a traveling vehicle located within the range of the branch-switching impossible distance from the branch point and scheduled to travel toward the main way at the branch point, after this moment as a starting point, proceeds toward the branch way when passing through the branch point first is excluded from the travel route candidates. Thus, a situation in which a traveling vehicle to which the command has been assigned is not able to change courses at the branch point and detours to travel to the destination point is able to be avoided. Accordingly, a traveling vehicle is able to quickly reach the destination point.

In a traveling vehicle controller according to a preferred embodiment of the present invention, the command assignment controller may calculate, for each of the travel route candidates, a period of time for each traveling vehicle to travel thereon, and may detect, as the first-to-arrive traveling vehicle, a traveling vehicle corresponding to a travel route candidate on which the period of time is shortest. Accordingly, the first-to-arrive traveling vehicle is able to be accurately detected.

In a traveling vehicle controller according to a preferred embodiment of the present invention, when having performed the pseudo-shift processing, the command assignment controller may add a period of time to travel between a pseudo-position of the traveling vehicle subjected to the pseudo-shift processing and an actual position of the traveling vehicle to the period of time calculated for the travel route candidate corresponding to the traveling vehicle. By this addition, the period of time of the travel route candidate of the traveling vehicle subjected to the pseudo-shift processing is able to be corrected.

In a traveling vehicle controller according to a preferred embodiment of the present invention, in the pseudo-shift processing, the traveling vehicle may be determined to be located downstream of the branch point and within a distance range equal or substantially equal to or shorter than a vehicle length of the traveling vehicle from the branch point. If the distance between the pseudo-position and the actual position of the traveling vehicle subjected to the pseudo-shift processing is longer, another traveling vehicle is more likely to exist therebetween. In this case, even though the other traveling vehicle is able to reach the destination point first, the traveling vehicle subjected to the pseudo-shift processing is recognized to be located in the pseudo-position, and thus there is a possibility that the command is assigned to the traveling vehicle subjected to the pseudo-shift processing. Accordingly, in the traveling vehicle controller, because the traveling vehicle is determined to be located within the distance range equal or substantially equal to or shorter than the vehicle length of the traveling vehicle from the branch point, there is no possibility that another traveling vehicle exists between the pseudo-position and the actual position of the traveling vehicle subjected to the pseudo-shift processing. Thus, a situation in which the command is assigned to the traveling vehicle subjected to the pseudo-shift processing although the command should be originally assigned to the other traveling vehicle is able to be avoided.

In a traveling vehicle controller according to a preferred embodiment of the present invention, the branch-switching impossible distance may be set to increase continuously or stepwise as the vehicle speed of the traveling vehicle increases. In order to reliably change courses of the traveling vehicle at the branch point, the branch-switching impossible distance being upstream from the branch point tends to increase as the vehicle speed of the traveling vehicle increases. Thus, in the traveling vehicle controller according to this aspect of a preferred embodiment of the present invention, the branch-switching impossible distance is able to be set according to this tendency.

A traveling vehicle controller according to a preferred embodiment of the present invention is a traveling vehicle controller to assign, to any one of a plurality of traveling vehicles that each travels on a travel path including a branch point, a command to travel to a destination point on the travel path. The traveling vehicle controller includes a command assignment controller to detect a first-to-arrive traveling vehicle that is able to reach the destination point first among the traveling vehicles, based on travel route candidates on which the traveling vehicles travel along the travel path from respective positions to reach the destination point, and assign the command to the first-to-arrive traveling vehicle. During detection of the first-to-arrive traveling vehicle, in a case when one of the traveling vehicles traveling toward the branch point on the travel path is located within a range of a branch-switching impossible distance from the branch point and is scheduled to travel toward a main way at the branch point, the command assignment controller excludes, from the travel route candidates, a post-course-switch travel route on which the one of the traveling vehicles proceeds toward a branch way when passing through the branch point first after the moment of the case as a starting point.

In the detection of the first-to-arrive traveling vehicle, when that traveling vehicle is located within the range of the branch-switching impossible distance from the branch point, the post-course-switch travel route is excluded from the travel route candidates. Thus, a situation in which a traveling vehicle to which the command has been assigned is not able to change courses at the branch point and detours to travel to the destination point is able to be avoided. Accordingly, a traveling vehicle is able to quickly reach the destination point.

A traveling vehicle system according to a preferred embodiment of the present invention includes a travel path including a branch point, a plurality of traveling vehicles that each travels along the travel path, and one of the traveling vehicle controllers according to various preferred embodiments of the present invention described above.

In the traveling vehicle system described above, because it includes one of the above-described traveling vehicle controllers, a traveling vehicle is able to quickly reach the destination point.

According to the preferred embodiments of the present invention, the traveling vehicle controllers and the traveling vehicle systems that each enable an empty traveling vehicle to quickly reach the destination point are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
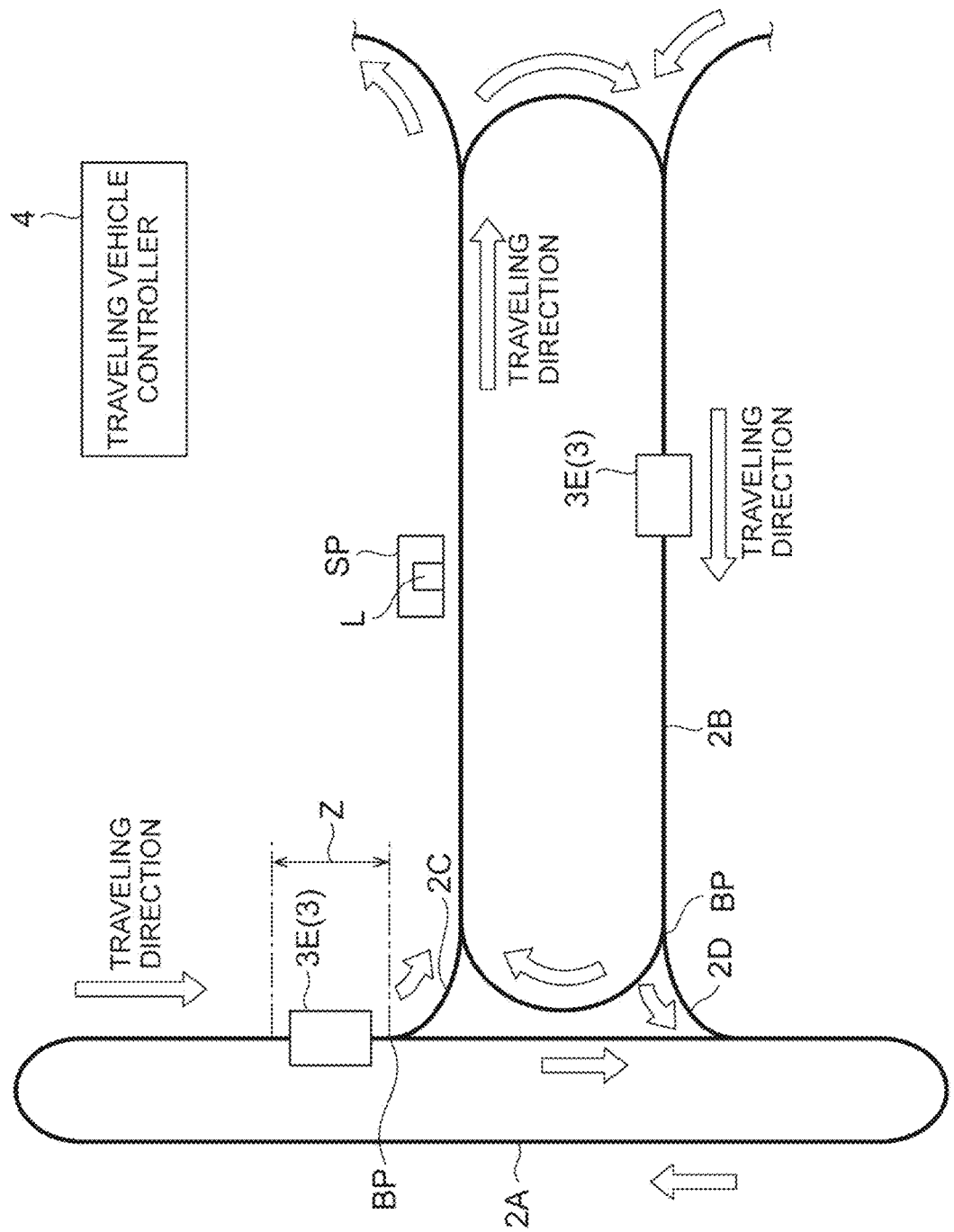
FIG. 1 is a diagram showing a traveling vehicle system according to a preferred embodiment of the present invention.

Preferred embodiments of the present invention will now be described with reference to the drawings. In description of the drawings, like elements are designated by like reference signs, and duplicate description is omitted. The scale in the drawings does not necessarily coincide with the size of a described object.

A traveling vehicle system 1 shown in FIG. 1 is a system in which a traveling vehicle 3 travels along a track 2 installed on a ceiling of a factory, for example. The traveling vehicle system 1 defines a transport system to convey loads L. The loads L are containers that each stores a plurality of semiconductor wafers, for example, and may be glass substrates and general parts, for example. The traveling vehicle system 1 mainly includes the track 2, a plurality of the traveling vehicles 3, and a traveling vehicle controller 4.

The track 2 is a predetermined travel path along which the traveling vehicles 3 travel. The track 2 is a one-way travel path. In other words, in the traveling vehicle system 1, as shown by white arrows in FIG. 1, the traveling direction (advancing direction) of each traveling vehicle 3 in the track 2 is set to be one direction, and traveling in the opposite direction is prohibited. The track 2 is suspended from the ceiling of a factory, for example. The track 2 includes a branch point BP. The branch point BP is a point at which a branch way is separated from a main way. The branch way corresponds to a traveling direction (course direction) different from that of the main way.

In the example of a track layout shown in FIG. 1, the track 2 includes two loop travel paths 2A, 2B and two communication travel paths 2C, 2D that provide communication between the loop travel paths 2A, 2B for traveling vehicles 3 to travel between the loop travel paths 2A, 2B. At a position where the communication travel path 2C is connected to the loop travel path 2A (branches off from the loop travel path 2A) and a position where the communication travel path 2D is connected to the loop travel path 2B (branches off from the loop travel path 2B), branch points BP are provided. At the branch point BP on the loop travel path 2A, either one of communication travel path 2C and the loop travel path 2A downstream of the branch point BP defines and functions as a main way, and the other defines and functions as a branch way.

Figure 2:
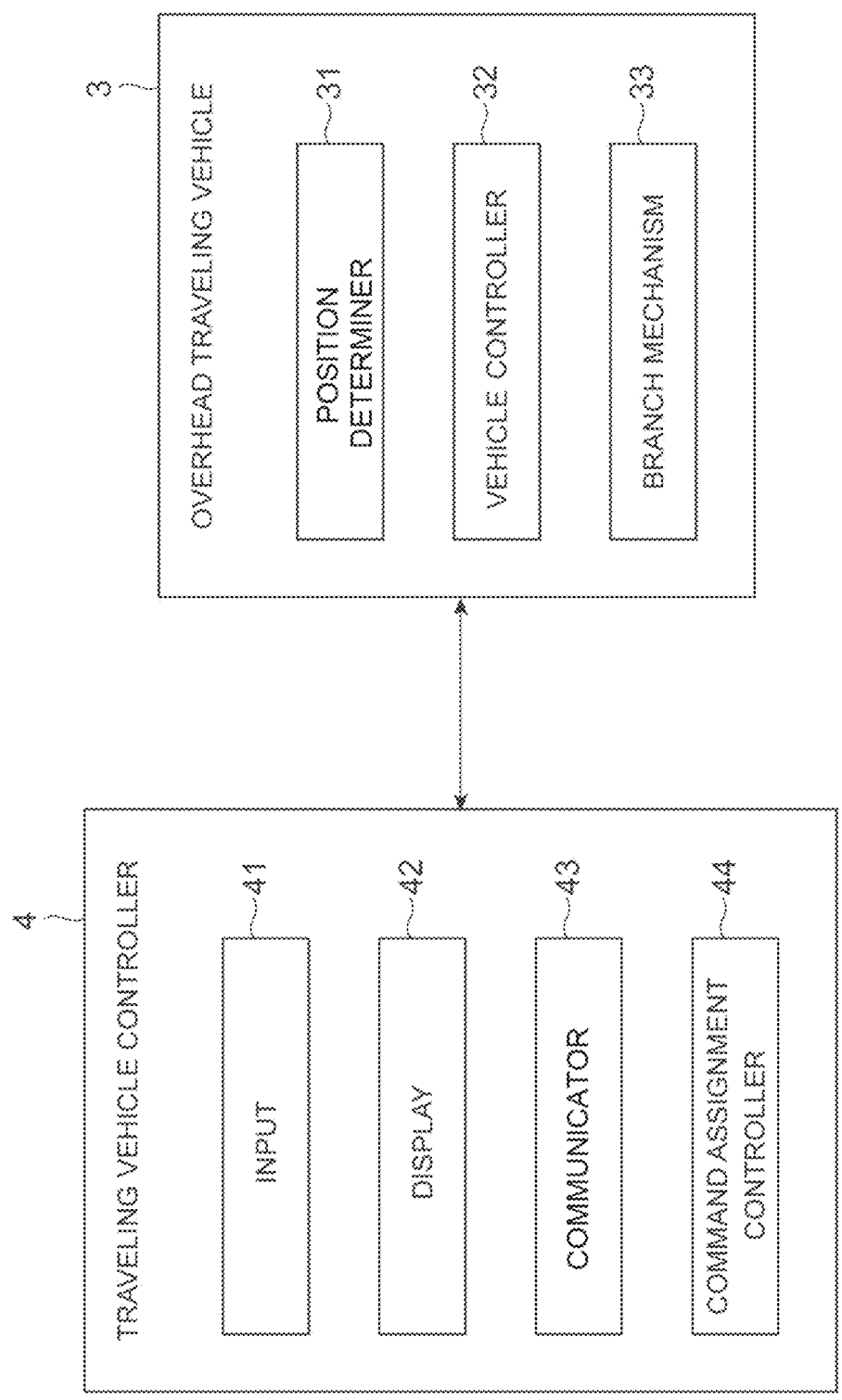
FIG. 2 is a block diagram showing features of a traveling vehicle system according to a preferred embodiment of the present invention.

Each traveling vehicle 3 is able to transfer a load L. The traveling vehicle 3 is an overhead traveling automated guided transport vehicle that travels along the track 2. The traveling vehicle 3 is also called, for example, a carriage (traveling carriage), an overhead traveling vehicle (overhead traveling carriage), or a transport vehicle (transport carriage). The traveling vehicle 3 includes a position determiner 31, a vehicle controller 32, and a branch mechanism 33 as shown in FIG. 2 in addition to a mechanism to transfer a load L to or from a load port, for example.

The position determiner 31 determines the position of the traveling vehicle 3 on the track 2. For example, the position determiner 31 includes a reader to read a point mark (e.g., bar code) that is attached in plurality to be aligned at regular intervals along the track 2 and an encoder. The position determiner 31 acquires positional information of the traveling vehicle 3 in the track 2. The positional information of the traveling vehicle 3 is provided from information of a point mark determined by the reader and the encoder. This positional information also includes information on a travel distance after the traveling vehicle 3 passes through the point mark.

The vehicle controller 32 controls operation of the traveling vehicle 3. The vehicle controller 32 is, for example, an electronic controller including a central processing unit (CPU), a read only memory (ROM), and a random access memory (RAM). The vehicle controller 32 may be implemented by, for example, software defined by a program that is able to be stored in the ROM and loaded into the RAM to be executed by the CPU. Herein, the vehicle controller 32 may be implemented by hardware, for example, an electronic circuit.

The vehicle controller 32 controls operation of the traveling vehicle 3 based on a transport command received from the traveling vehicle controller 4. In the transport command, for example, a loading port that is a load port on which a load L to be conveyed is placed and an unloading port that is a load port to which the load L is to be conveyed are specified. The vehicle controller 32 causes the traveling vehicle 3 to travel to the loading port and load the load L thereon, and then causes the traveling vehicle 3 travel to the unloading port and unload the load L therefrom. The vehicle controller 32 performs park control of causing the traveling vehicle 3 to travel to a standby section where the traveling vehicle 3 is to be put on standby. The vehicle controller 32 performs ejection control of causing the traveling vehicle 3 to travel to depart from the standby section. Specific processes for the park control and the ejection control are not limited to particular ones, and various known processes may be implemented.

The branch mechanism 33 is a mechanism to change the traveling direction of the traveling vehicle 3 at a branch point BP. The branch mechanism 33 switches a branch lever (not shown) in accordance with the traveling direction of the traveling vehicle at the branch point BP. This switching occurs over a predetermined period of time.

The traveling vehicle 3 periodically transmits traveling information on a traveling status of the traveling vehicle 3 to the traveling vehicle controller 4. The traveling information is information representing a state of the traveling vehicle 3 itself. The traveling information includes at least the positional information of the traveling vehicle 3, vehicle speed information of the traveling vehicle 3, information on the presence or absence of a load L, information on whether the traveling vehicle 3 is traveling (e.g., which is performing the park control or the ejection control), and, if the traveling vehicle 3 is traveling, a travel schedule route related to a schedule of this traveling (travel plan).

As shown in FIG. 1 and FIG. 2, the traveling vehicle controller 4 defines and functions as a host controller for the vehicle controller 32. For example, when having received a loading request to acquire a load L in a loading port SP from a manufacturing controller (not shown) or the like, the traveling vehicle controller 4 generates a transport command corresponding to this loading request. The loading port SP is a port on which a load L requested to be loaded among a plurality of ports aligned parallel or substantially parallel to each other along the track 2. Examples of this port include a load port of a processing device, a loading-and-unloading port of a stocker, and a buffer as a place where a load L is temporarily stored. The loading port SP is also called a from-port. A method to generate the transport command is not limited to a particular one, and various known methods may be implemented.

The transport command includes at least a command to cause the traveling vehicle 3 to travel to a destination point P corresponding to the position of the loading port SP on the track 2. The destination point P is a position where a load L is able to be loaded (carried) from the loading port SP, and is a position around or a position adjacent to or in a vicinity of the loading port SP. The destination point P is a target position of traveling in response to the transport command. The transport command includes a command to cause the traveling vehicle 3 to load a load L thereon at the loading port SP. The traveling vehicle controller 4 assigns the transport command to an empty traveling vehicle 3E of a plurality of traveling vehicles 3 (described below). The empty traveling vehicle 3E is a traveling vehicle 3 to which a transport command has not been assigned, including a traveling vehicle 3 that is empty without a load L being conveyed.

The traveling vehicle controller 4 is configured or programmed to include an input 41, a display 42, a communicator 43, and a command assignment controller 44. The input 41 is, for example, a keyboard and a mouse and to which various operations and various set values are input by a user. The display 42, for example, includes a liquid crystal display and displays, for example, a screen for various settings and display a screen for inputs input with the input 41. The communicator 43 is a processing device that communicates with another device, for example. The communicator 43, for example, transmits a transport command to a traveling vehicle 3 and receives traveling information of the traveling vehicle 3 via a wireless communication network.

The command assignment controller 44 is, for example, an electronic controller including a CPU, a ROM, and a RAM. The command assignment controller 44 may be implemented by, for example, software defined by a program that is able to be stored in the ROM and loaded into the RAM to be executed by the CPU. Herein, the command assignment controller 44 may be implemented by hardware, for example, an electronic circuit.

The command assignment controller 44 detects a first-to-arrive empty traveling vehicle (first-to-arrive traveling vehicle, hereinafter, simply called "first-to-arrive empty traveling vehicle") that is able to reach the destination point P first among a plurality of empty traveling vehicles 3E based on a plurality of travel route candidates on which the empty traveling vehicles 3E travel along the track 2 from the respective positions thereof to reach the destination point P. Specifically, the command assignment controller 44 detects the first-to-arrive empty traveling vehicle based on the respective total costs of the travel route candidates. The command assignment controller 44 calculates the total costs of the respective travel route candidates, and detects as the first-to-arrive empty traveling vehicle an empty traveling vehicle 3E corresponding to a travel route candidate the total cost of which is the lowest. The command assignment controller 44 assigns a transport command to the first-to-arrive empty traveling vehicle thus detected.

Each travel route candidate is a candidate of the locus of an empty traveling vehicle 3E to travel, which is set between the position of the empty traveling vehicle 3E and the destination point P on the track 2. The total cost is a period of time for the traveling vehicle 3 to travel on the travel route candidate. The total cost is able to be determined based on a route distance that is a distance along an itinerary (locus) of the travel route candidate and the estimated vehicle speed of the traveling vehicle 3. For the total cost, a period of time for a straight route is shorter even if the route distance is long, and a period of time for a curved route is longer even if the distance is short. The total cost is a value determined by adding up a cost along the travel route candidate. For sections (inter-point mark sections) that are separated by the respective point marks attached to the track 2, the cost corresponds to a period of time for the traveling vehicle 3 to travel in each section. A cost is set (assigned) to each point mark in advance. The total cost will be described below.

Herein, during detection of the first-to-arrive empty traveling vehicle, in a case when an empty traveling vehicle 3E traveling toward a branch point BP is located within a range of a branch-switching impossible distance Z from the branch point BP and is scheduled to travel toward a main way at the branch point BP, the command assignment controller 44 excludes from the travel route candidates a post-course-switch travel route that is a travel route on which this empty traveling vehicle 3E proceeds toward a branch way when passing through the branch point BP first after the moment of the case as a starting point (hereinafter, simply called "post-course-switch travel route").

The branch-switching impossible distance Z corresponds to a distance to switch the branch mechanism 33 from its current state in which the traveling vehicle 3 is to branch off toward the main way or toward the branch way at the branch point BP to a state in which the traveling vehicle 3 is to branch off toward the opposite branch way. Because the traveling vehicle 3 switches the branch mechanism 33 while traveling on the track 2, the branch-switching impossible distance Z is, in other words, a shortest travel distance to switch the branch mechanism 33 to the state in which the traveling vehicle 3 is to branch off toward the opposite branch way while traveling. When the distance between the traveling vehicle 3 and the branch point BP is shorter than the branch-switching impossible distance Z, the traveling vehicle 3 is not able to switch the branch mechanism 33 to the state in which it is to branch off toward the opposite branch way before reaching to the branch point BP. The branch-switching impossible distance Z is a threshold that is set in advance and stored. The branch-switching impossible distance Z is set to increase continuously or stepwise as the vehicle speed of the empty traveling vehicle 3E increases. The branch-switching impossible distance Z herein is set for each of a short distance, a middle distance, and a long distance based on the cases when the vehicle speed of the empty traveling vehicle 3E is low, middle, and high, respectively, as exemplified below, for example. The branch-switching impossible distance Z is able to be determined by tests, experiences, or a simulation, for example.

Low speed (lower than 1000 mm/s): Short distance
Middle speed (equal or substantially equal to or higher than 1000 mm/s and lower than 2000 mm): Middle distance
High speed (higher than 2000 mm/s): Long distance The position of the empty traveling vehicle 3E that is a criterion to determine whether it is located within the range of the branch-switching impossible distance Z is not limited to a particular one, and may be a position of the reader of the position determiner 31 in the empty traveling vehicle 3E, or may be a central position (position of the center of gravity), a front-end position, or a rear-end position of the empty traveling vehicle 3E. The position of the branch point BP as a starting point of the branch-switching impossible distance Z is not limited to a particular one, and may be set with respect to a point of intersection of the respective central lines of the main way and the branch way, or may be set with respect to any point in an area to branch on the track 2.

The command assignment controller 44 as described above performs specifically pseudo-shift processing and inverse route search processing (search processing). The following describes the pseudo-shift processing and the inverse route search processing.

Figure 3:
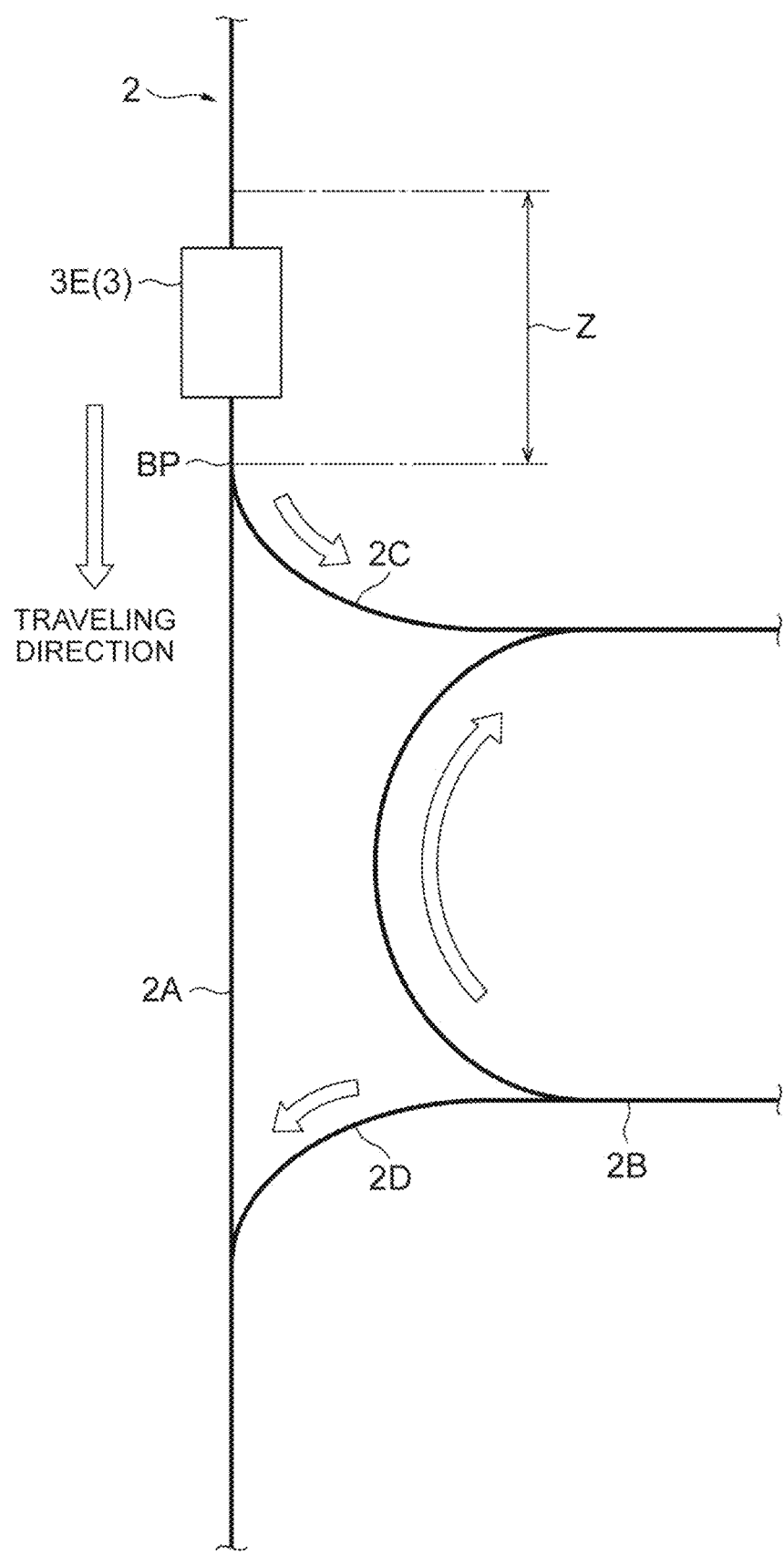
FIG. 3 is a diagram showing pseudo-shift processing according to a preferred embodiment of the present invention.
Figure 4:
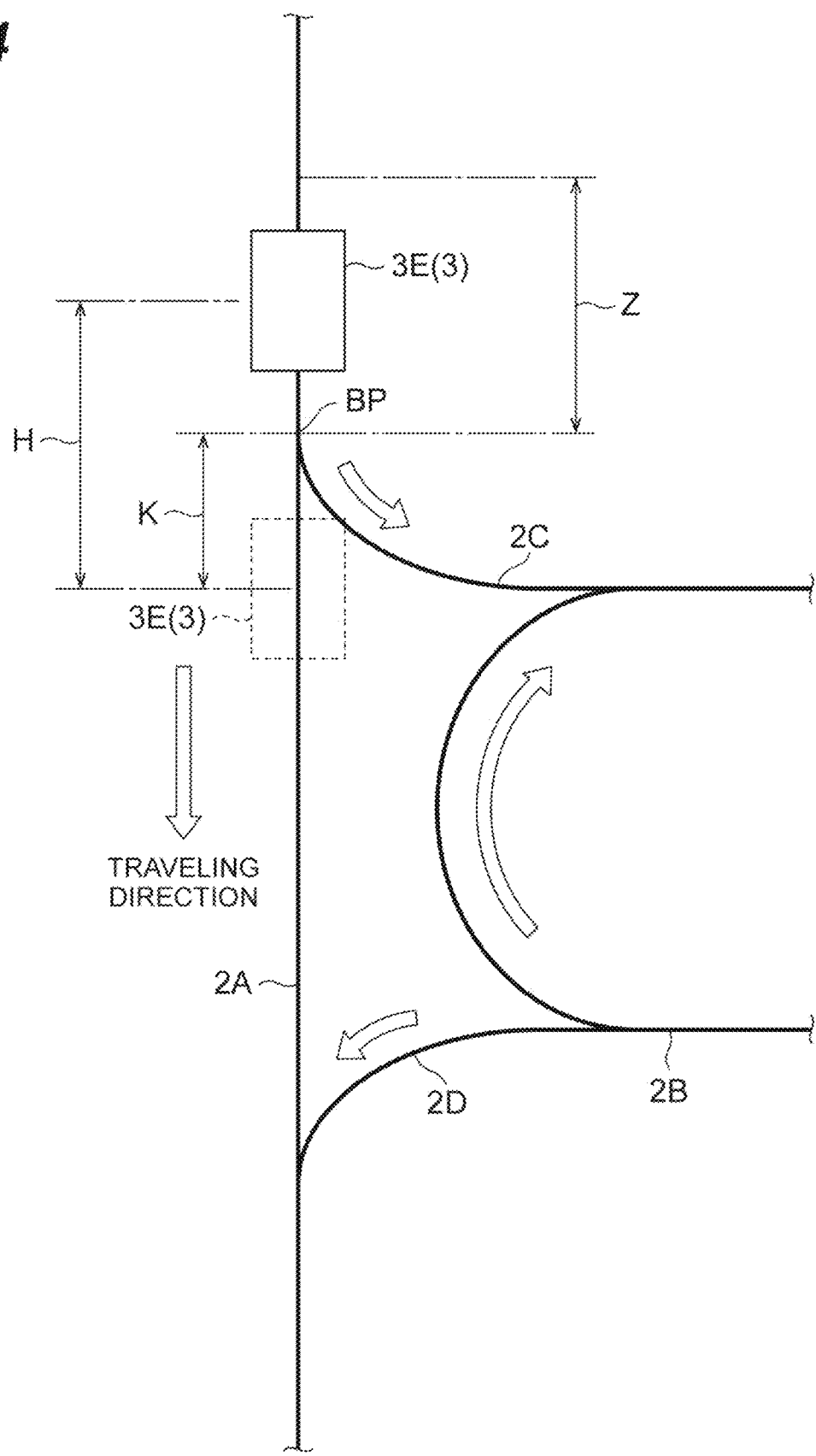
FIG. 4 is another diagram showing a pseudo-shift processing according to a preferred embodiment of the present invention.

As shown in FIG. 3 and FIG. 4, when an empty traveling vehicle 3E traveling toward a branch point BP on the track 2 is located within a range of a branch-switching impossible distance Z from the branch point BP and is scheduled to travel toward the main way at the branch point BP, the pseudo-shift processing determines, during detection of the first-to-arrive empty vehicle, that the empty traveling vehicle 3E is located at a position downstream of the branch point BP and on the side of the main way. Specifically, when the remaining distance for the empty traveling vehicle 3E up to the branch point BP is shorter than the branch-switching impossible distance Z, the pseudo-shift processing virtually shifts the position of the empty traveling vehicle 3E recognized by the traveling vehicle controller 4 from upstream of the branch point BP to downstream thereof on the travel schedule route of the empty traveling vehicle 3E. In other words, the pseudo-shift processing shifts the position (actual position) of the empty traveling vehicle 3E that is approaching to a distance equal or substantially equal to or shorter than the branch-switching impossible distance Z from the branch point BP to a position (pseudo-position) on the side of the main way that is downstream of the branch point BP and on which the empty traveling vehicle 3E is scheduled to travel in recognition of the traveling vehicle controller 4.

The example shown in FIG. 3 and FIG. 4 is an example in which an empty traveling vehicle 3E proceeds straight at a branch point BP (proceeds toward the loop travel path 2A at the branch point BP). In this example, the pseudo-shift processing fictitiously determines the position of the empty traveling vehicle 3E that is traveling upstream of the branch point BP on the track 2 and within the range of the branch-switching impossible distance Z as a position on the loop travel path 2A on the side of proceeding straight downstream of the branch point BP.

As shown in FIG. 4, the pseudo-shift processing determines that the empty traveling vehicle 3E is located downstream of the branch point BP and within a distance range K equal or substantially equal to or shorter than the vehicle length of the empty traveling vehicle 3E from the branch point BP. In other words, the pseudo-shift processing causes the position of the empty traveling vehicle 3E to jump from upstream of the branch point BP to downstream thereof, and the landing spot is set to be immediately ahead of the branch point BP. For example, the position of a point mark attached immediately downstream of the branch point BP on the track 2 is located apart from the branch point BP by a distance equal or substantially equal to or shorter than the vehicle length of the empty traveling vehicle 3E, and thus the pseudo-shift processing sets the position of this point mark as a pseudo-position. The pseudo-shift processing is periodically performed. Herein, the pseudo-shift processing is performed every time when new traveling information is received.

Figure 5:
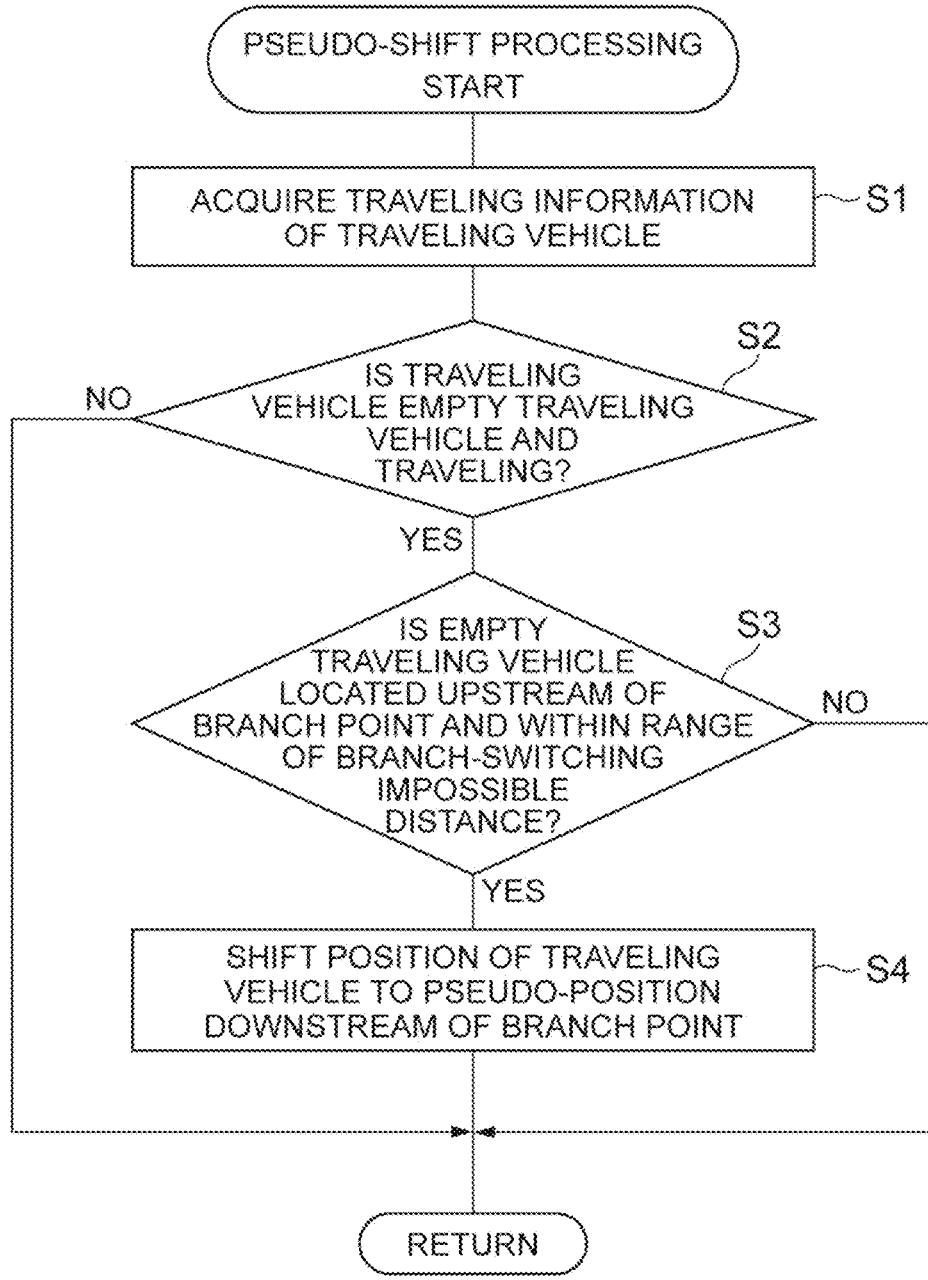
FIG. 5 is a flowchart showing a pseudo-shift processing according to a preferred embodiment of the present invention.

As one example, in the pseudo-shift processing, a series of processes shown in FIG. 5 is periodically and repeatedly performed for each of the traveling vehicles 3. Specifically, to begin with, traveling information is acquired from each traveling vehicle 3 (step S1). Based on the traveling information, whether the traveling vehicle 3 is an empty traveling vehicle 3E and is traveling is determined (step S2). If YES at step S2 above, based on the traveling information, whether the empty traveling vehicle 3E is located upstream of a branch point BP and within a range of a branch-switching impossible distance Z is determined (step S3).

If YES at step S3 above, the position of the empty traveling vehicle 3E internally recognized by the traveling vehicle controller 4 is fictitiously shifted from the actual position (position upstream of the branch point BP) based on the traveling information to a pseudo-position (pseudo-position downstream of the branch point BP and on the side of a main way for which the empty traveling vehicle 3E is heading) (step S4). If NO at step S2 above, if NO at step S3 above, or after step S4 above, the series of processes in this period is completed, and then step S1 above is performed again in the next period.

By the pseudo-shift processing described above, when the traveling vehicle controller 4 has recognized that the empty traveling vehicle 3E is located in the pseudo-position, a post-course-switch travel route is not searched for in the inverse route search processing described later, that is, the post-course-switch travel route is excluded from a plurality of travel route candidates that are provided as references during detection of the first-to-arrive empty traveling vehicle.

The inverse route search processing searches for a shortest travel route candidate that is a travel route candidate the total cost of which is smallest, and detects as a first-to-arrive empty traveling vehicle an empty traveling vehicle 3E corresponding to the shortest travel route candidate thus searched for. The shortest travel route candidate is a travel route candidate that provides the quickest arrival at the destination point P. The inverse route search processing is performed when the traveling vehicle controller 4 has generated a transport command.

Specifically, the inverse route search processing includes first to fifth processes. The first process examines routes on the track 2 to trace them from the destination point P in a direction opposite to the traveling direction of each empty traveling vehicle 3E, thereby searching for a travel route candidate. The second process sets the travel route candidate searched for in the first process as a shortest travel route candidate, and also sets the total cost of this travel route candidate as a minimum cost (shortest period of time). The third process examines routes on the track 2 to trace them from the destination point P in a direction opposite to the traveling direction of each empty traveling vehicle 3E, thereby searching for a travel route candidate the total cost of which is smaller than the minimum cost. The fourth process sets the travel route candidate searched for in the third process as a shortest travel route candidate, and also sets the total cost of this travel route candidate as a minimum cost, and then returns to the third process. If a travel route candidate is not able to be searched for in the third process and unexamined routes have become depleted on the track 2, the fifth process ends the processing.

Figure 6:
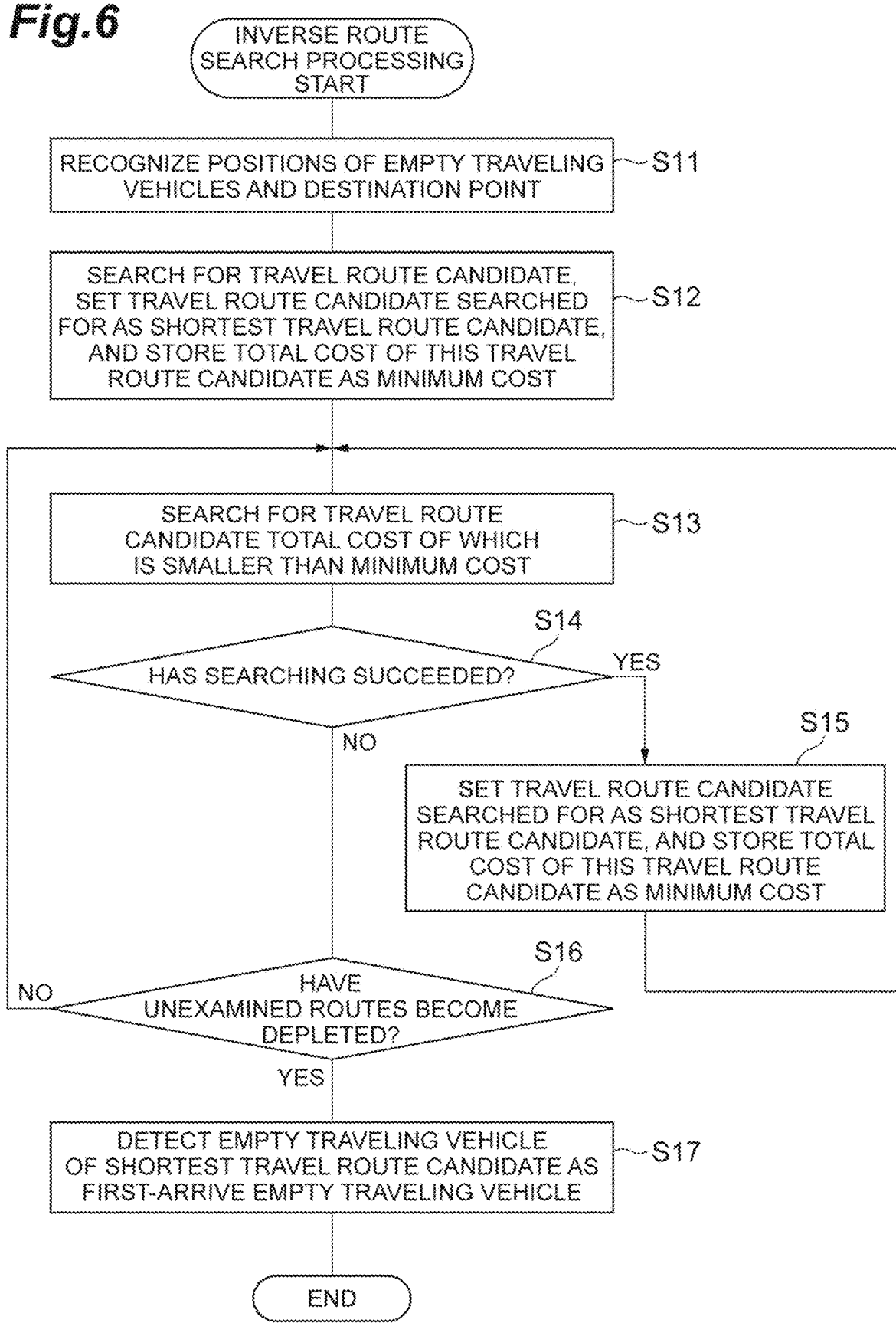
FIG. 6 is a flowchart showing inverse route search processing according to a preferred embodiment of the present invention.

As one example, in the inverse route search processing, a series of processes shown in FIG. 6 is performed when the traveling vehicle controller 4 has generated a transport command. Specifically, to begin with, the positions of a plurality of empty traveling vehicles 3E and the position of the destination point P in the generated transport command are recognized (step S11). A travel route candidate is searched for, the travel route candidate searched for is set as a shortest travel route candidate, and also the total cost of this travel route candidate is set as a minimum cost to be stored in the traveling vehicle controller 4 (step S12).

A travel route candidate the total cost of which is smaller than the minimum cost on the track 2 is searched for (step S13). Whether the searching at step S13 above has succeeded and a new travel route candidate the total cost of which is smaller than the minimum cost has been found is determined (step S14). If YES at step S14 above, the travel route candidate that has been searched for is set as a shortest travel route candidate and also the total cost of this travel route candidate is set as a minimum cost to be stored (overwritten) in the traveling vehicle controller 4 (step S15). Subsequently, the processing returns to the process of step S13 above.

If NO at step S14 above, whether unexamined routes have become depleted on the track 2 is determined (step S16). If NO at step S16 above, the processing returns to the process of step S13 above. If YES at step S16 above, the empty traveling vehicle 3E of the shortest travel route candidate is detected as a first-to-arrive empty traveling vehicle, and the inverse route search processing ends (step S17).

FIGS. 7A and 7B to FIG. 11 are diagrams showing features of the inverse route search processing. In the following description, an example of another track layout is provided that is different from the track layout of FIG. 1 for convenience in description. In the example of the track layout shown in FIGS. 7A and 7B to FIG. 11, the track 2 is depicted with a plurality of point marks I1 to I23 attached to the track 2 and links between the point marks I1 to I23. A destination point P of a transport command corresponds to the position of the point mark I8. An empty traveling vehicle 3E is in a position corresponding to the point mark I2.

In the traveling vehicle controller 4, cost tables set in advance for the respective point marks I1 to I23 are stored. In each cost table, a cost is set for each point mark to be traced in examination. For example, the cost table for the point mark I4 includes information in which the cost of examination tracing the point mark I5 is 1, the cost of examination tracing the point mark I11 is 2, and the cost of examination tracing the point mark I3 is 1. The cost tables are able to be constructed by tests, experiences, or a simulation, for example. The cost tables are able to be constructed based on, for example, lengths and shapes of links that are connected to the corresponding point marks.

Figure 7A:
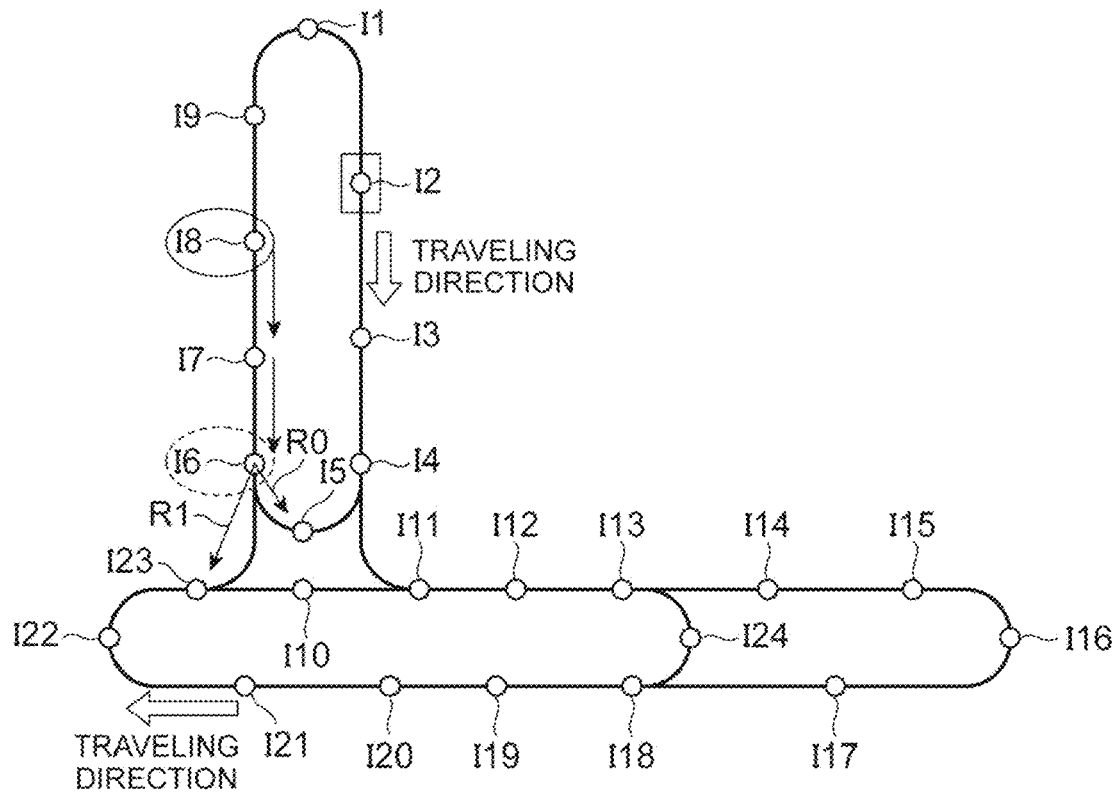
FIG. 7A is a diagram showing inverse route search processing according to a preferred embodiment of the present invention.

As shown in FIG. 7A, to begin with, routes are examined to be traced from the point mark I8 corresponding to the destination point P in a direction opposite to the traveling direction of the empty traveling vehicle 3E to prepare a route table R0. In the route table R0, as expressed by Formula (1) below, the point marks I8, I7, I6 that are aligned in the order of tracing in the examination are set as route data.

$$R0=I8,I7,I6 \quad (1)$$

Costs are added up by referring to the cost tables of the respective point marks I8, I7, I6 traced in the route examination to calculate the total cost of the route table R0. For example, the cost of route examination tracing the point mark I7 is 1 in the cost table for the point mark I8, and the cost of route examination tracing the point mark I6 is 1 in the cost table for the point mark I7, and thus the total cost of the route table R0 herein is 2.

Subsequently, because the point mark I6 corresponds to a merging point (branch point in the inverse route search processing) of the track 2, a route table R1 is newly prepared, and the route tables R0, R1 of Formulas (2), (3) below are set. Costs are added up for the respective route tables R0, R1 to calculate the total costs of the route tables R0, R1.

$$R0=I8,I7,I6,I5 \quad (2)$$

$$R1=I8,I7,I6,I23 \quad (3)$$

Figure 7B:
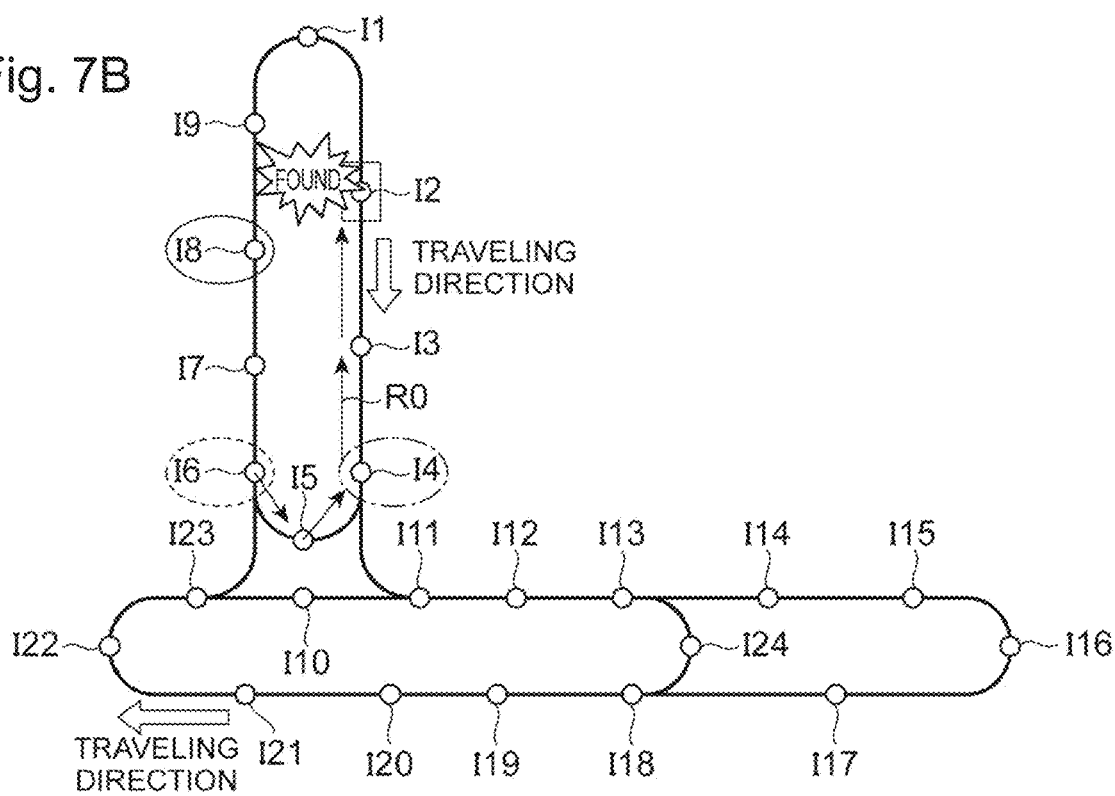
FIG. 7B is a diagram showing a continuation of FIG. 7A.

As shown in FIG. 7B, for the route table R0, the route examination is continued, and also costs are added up to calculate the total cost. Consequently, the empty traveling vehicle 3E is found at the position of the point mark I2, and the route table R0 of Formula (4) below is searched for as information of the shortest travel route candidate, and thus the route examination of the route table R0 is completed. The total cost of the route table R0 is stored as the minimum cost.

$$R0=I8,I7,I6,I5,I4,I3,I2 \quad (4)$$

Herein, in order to reduce the amount of route data, point marks set in the route tables may be limited to point marks that correspond to any of the destination point P, the branch point BP, and the empty traveling vehicle 3E. Thus, Formula (4) above may be rewritten as Formula (5) below. Hereinafter, similar features apply to other route tables.

$$R0=I8,I4,I3,I2 \quad (5)$$

Figure 8A:
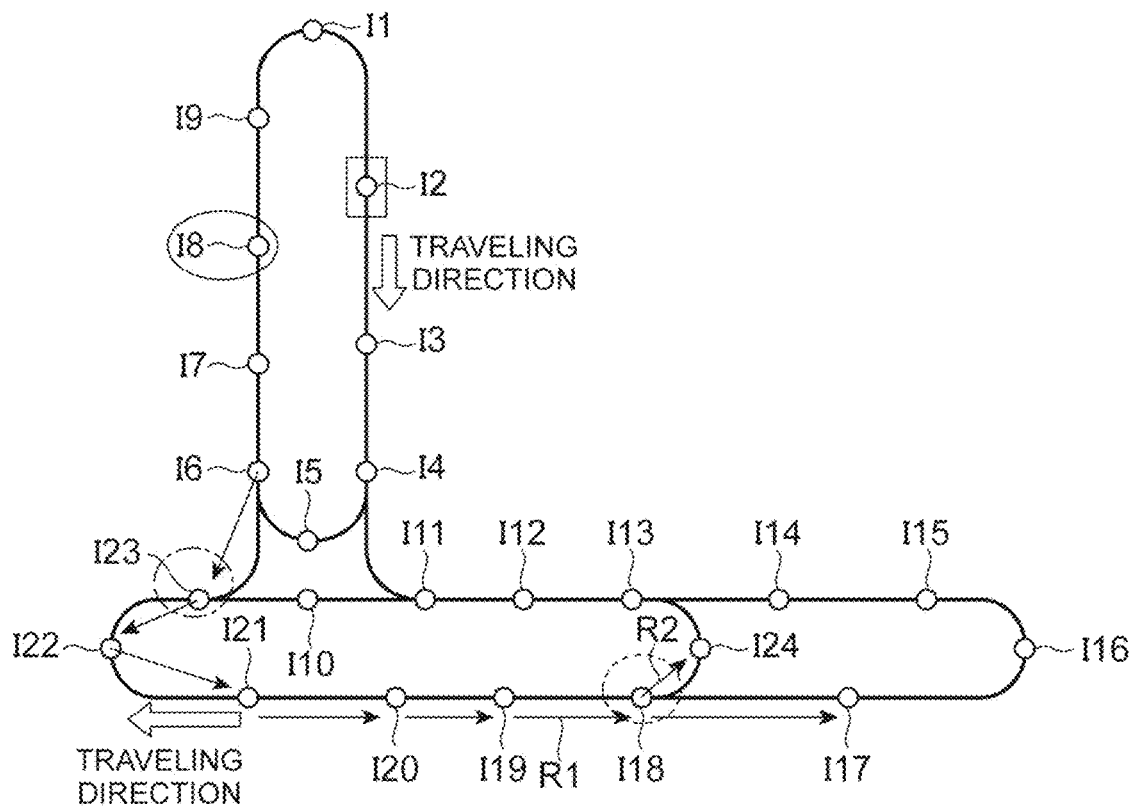
FIG. 8A is a diagram showing a continuation of FIG. 7B.

As shown in FIG. 8A, for the route table R1, the route examination is continued, and also costs are added up to calculate the total cost. Thus, the route table R1 of Formula (6) below is set.

$$R1=I8,I23,I22,I21,I20,I19,I18 \quad (6)$$

Subsequently, because the point mark I18 corresponds to a merging point of the track 2, a route table R2 is newly prepared, and the route tables R1, R2 of Formulas (7), (8) below are set. Costs are added up for the respective route tables R1, R2 to calculate the total costs of the route tables R1, R2.

$$R1=I8,I23,I22,I21,I20,I19,I18,I17 \quad (7)$$

$$R2=I8,I23,I22,I21,I20,I19,I18,I24 \quad (8)$$

Figure 8B:
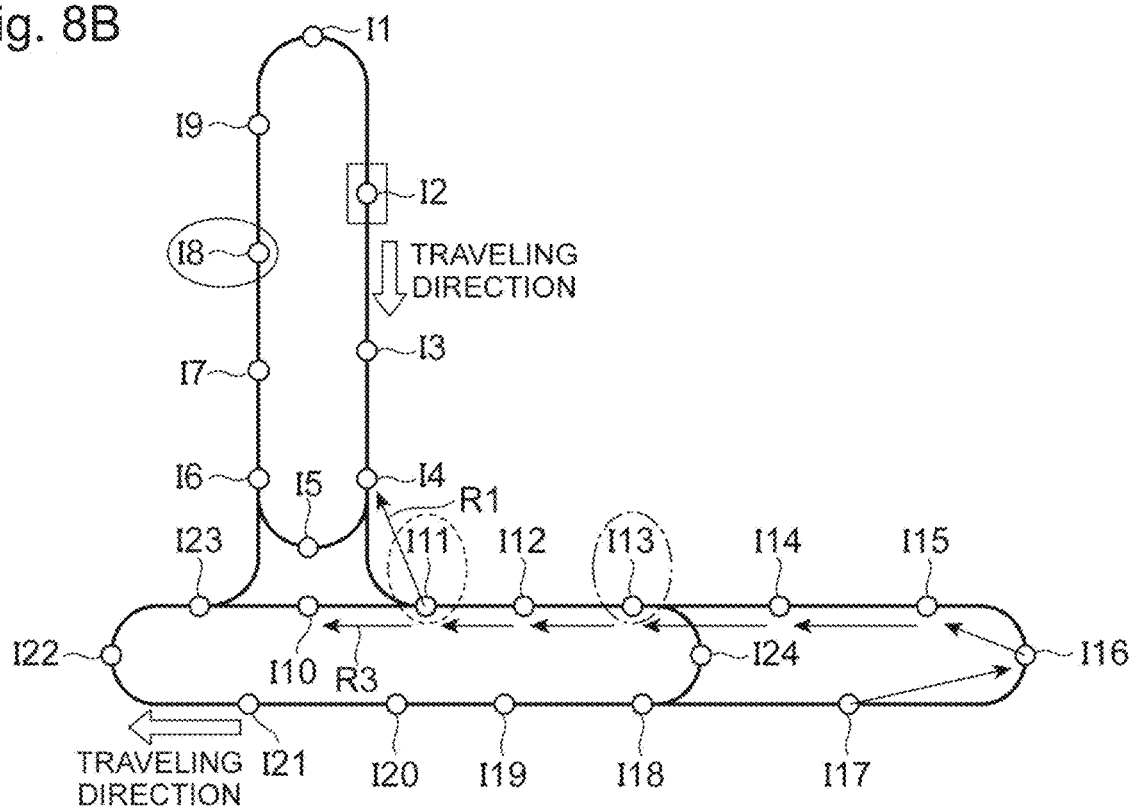
FIG. 8B is a diagram showing a continuation of FIG. 8A.

As shown in FIG. 8B, for the route table R1, the route examination is continued, and also costs are added up to calculate the total cost. Thus, the route table R1 of Formula (9) below is set.

$$R1=I8,I23,I13,I12,I11 \quad (9)$$

Subsequently, because the point mark I11 corresponds to a merging point of the track 2, a route table R3 is newly prepared, and thus the route tables R1, R3 of Formulas (10), (11) below are set. Costs are added up for the respective route tables R1, R3 to calculate the total costs of the route tables R1, R3.

$$R1=I8,I23,I13,I12,I11,I4 \quad (10)$$

$$R3=I8,I23,I13,I12,I11,I10 \quad (11)$$

Figure 9A:
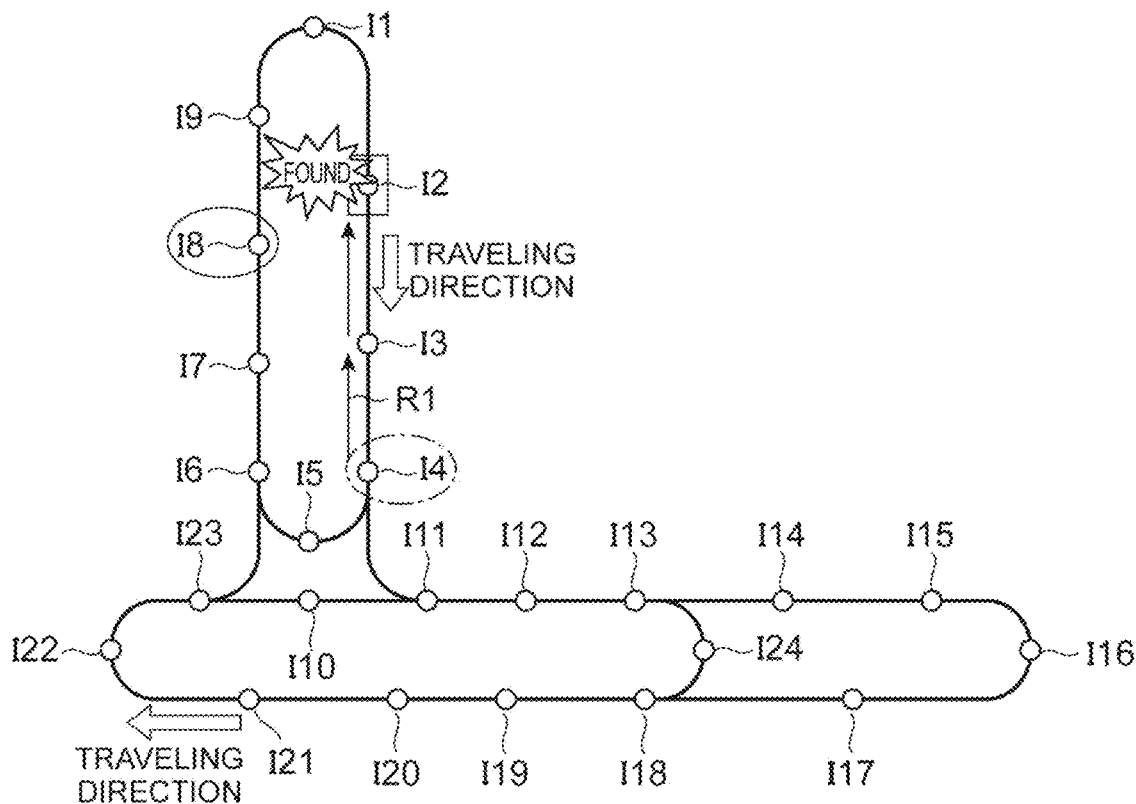
FIG. 9A is a diagram showing a continuation of FIG. 8B.

As shown in FIG. 9A, for the route table R1, the route examination is continued, and also costs are added up to calculate the total cost. Thus, the route table R1 of Formula (12) is set. Consequently, the empty traveling vehicle 3E is found at the position of the point mark I2, and the route examination of the route table R1 is completed. If the total cost of the route table R1 is smaller than the minimum cost that is currently stored, the route table R1 of Formula (12) below is searched for as information of the shortest travel route candidate, and also the currently stored one is overwritten with the total cost of the route table R1 as the minimum cost. However, in route examination in the route table R1, at the time when the total cost has exceeded the minimum cost, further examination is not necessary, and thus the examination may be stopped (similar features apply to the other route examination).

$$R1=I8,I23,I13,I4,I3,I2 \quad (12)$$

Figure 9B:
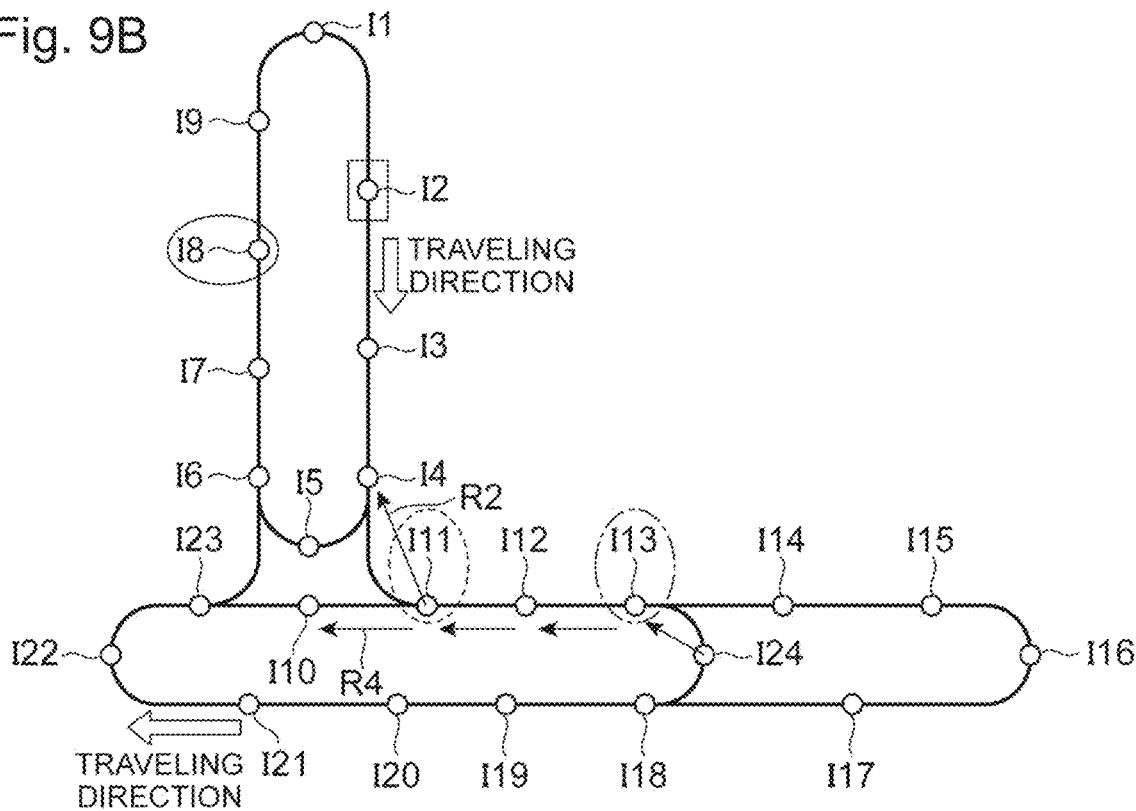
FIG. 9B is a diagram showing a continuation of FIG. 9A.

As shown in FIG. 9B, for the route table R2, the route examination is continued, and also costs are added up to calculate the total cost. Thus, the route table R2 of Formula (13) below is set.

$$R2=I8,I23,I13,I12,I11 \quad (13)$$

Subsequently, because the point mark I11 corresponds to a merging point of the track 2, a route table R4 is newly prepared, and the route tables R2, R4 of Formulas below (14), (15) are set. Costs are added up for the respective route tables R2, R4 to calculate the total costs of the route tables R2, R4.

$$R2=I8,I23,I13,I12,I11,I4 \quad (14)$$

$$R4=I8,I23,I13,I12,I11,I10 \quad (15)$$

Figure 10A:
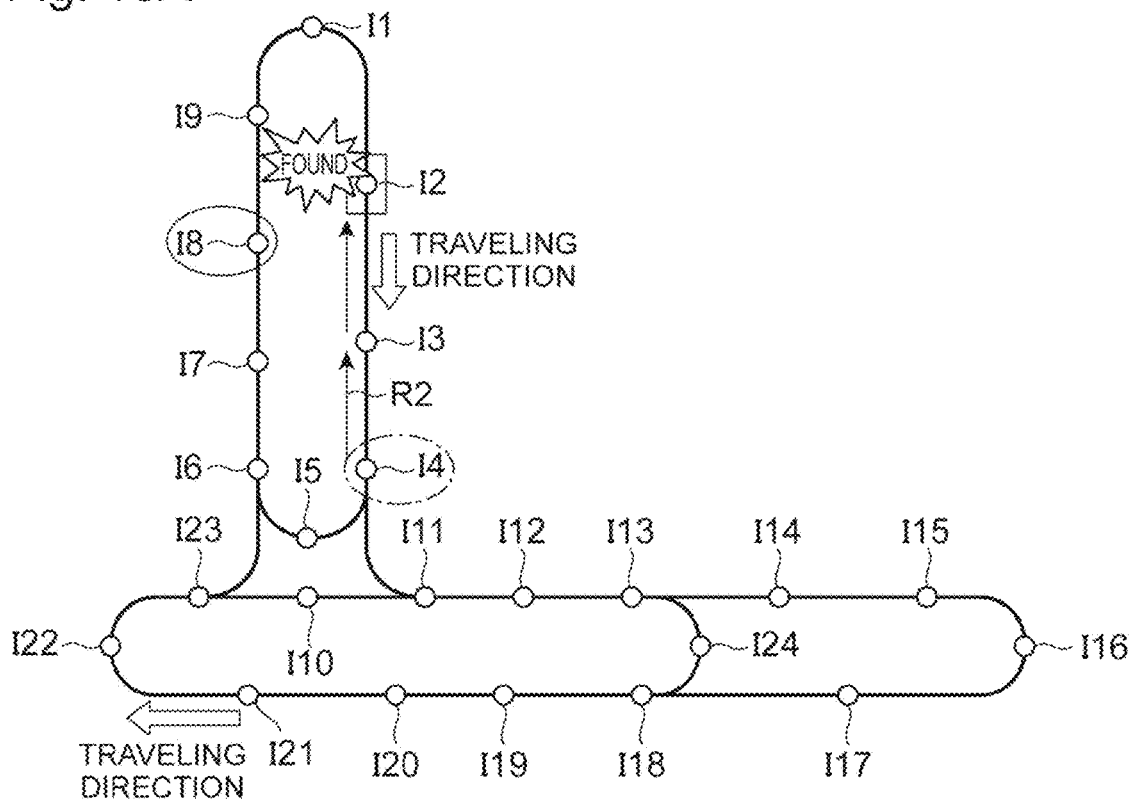
FIG. 10A is a diagram showing a continuation of FIG. 9B.

As shown in FIG. 10A, for the route table R2, the route examination is continued, and also costs are added up to calculate the total cost. Thus, the route table R2 of Formula (16) below is set. Consequently, the empty traveling vehicle 3E is found at the position of the point mark I2, and the route examination of the route table R2 is completed. If the total cost of the route table R2 is smaller than the minimum cost that is currently stored, the route table R2 of Formula (16) below is searched for as information of the shortest travel route candidate, and also the currently stored one is overwritten with the total cost of the route table R2 as the minimum cost.

$$R2=I8,I23,I13,I4,I3,I2 \quad (16)$$

Figure 10B:
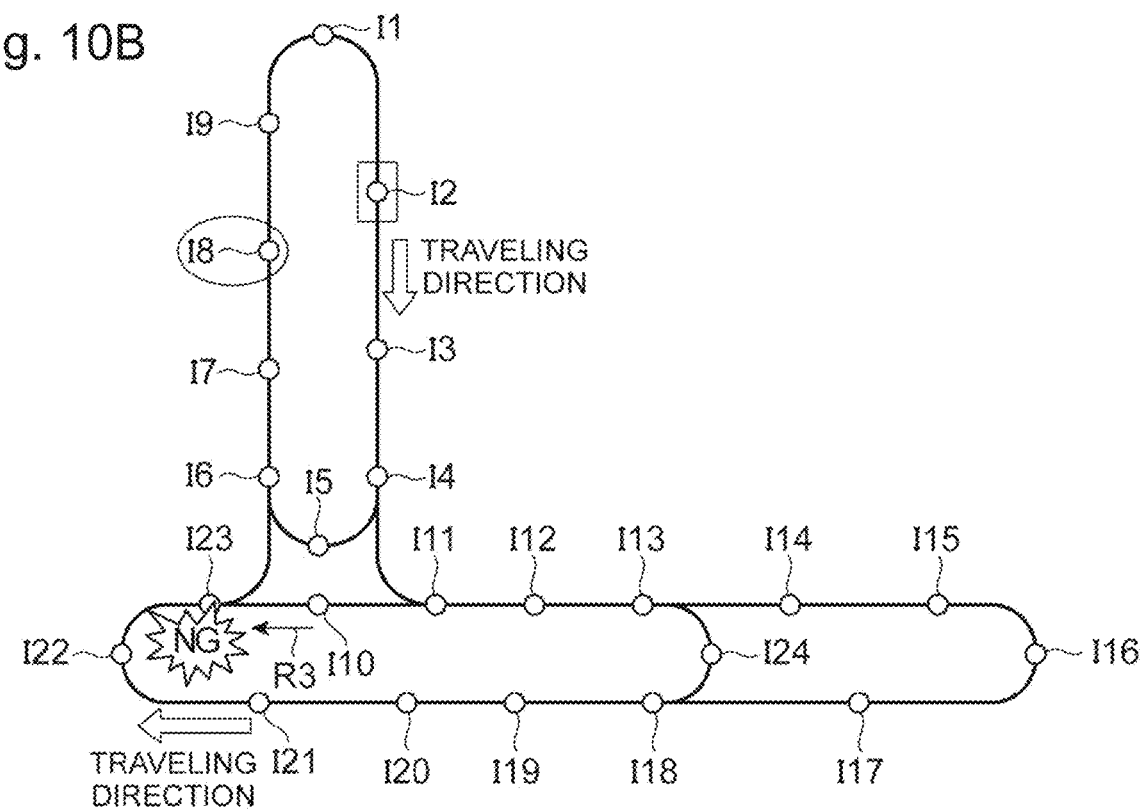
FIG. 10B is a diagram showing a continuation of FIG. 10A.

As shown in FIG. 10B, for the route table R3, the route examination is continued, and also costs are added up to calculate the total cost. Thus, the route table R3 of Formula (17) below is set. Because the route table R3 includes the point mark I23 two times (i.e., includes a point mark that has been already traced), it is determined at this point of time further examination is not necessary, and the examination is stopped.

$$R3=I8,I23,I13,I12,I11,I10,I23 \quad (17)$$

Figure 11:
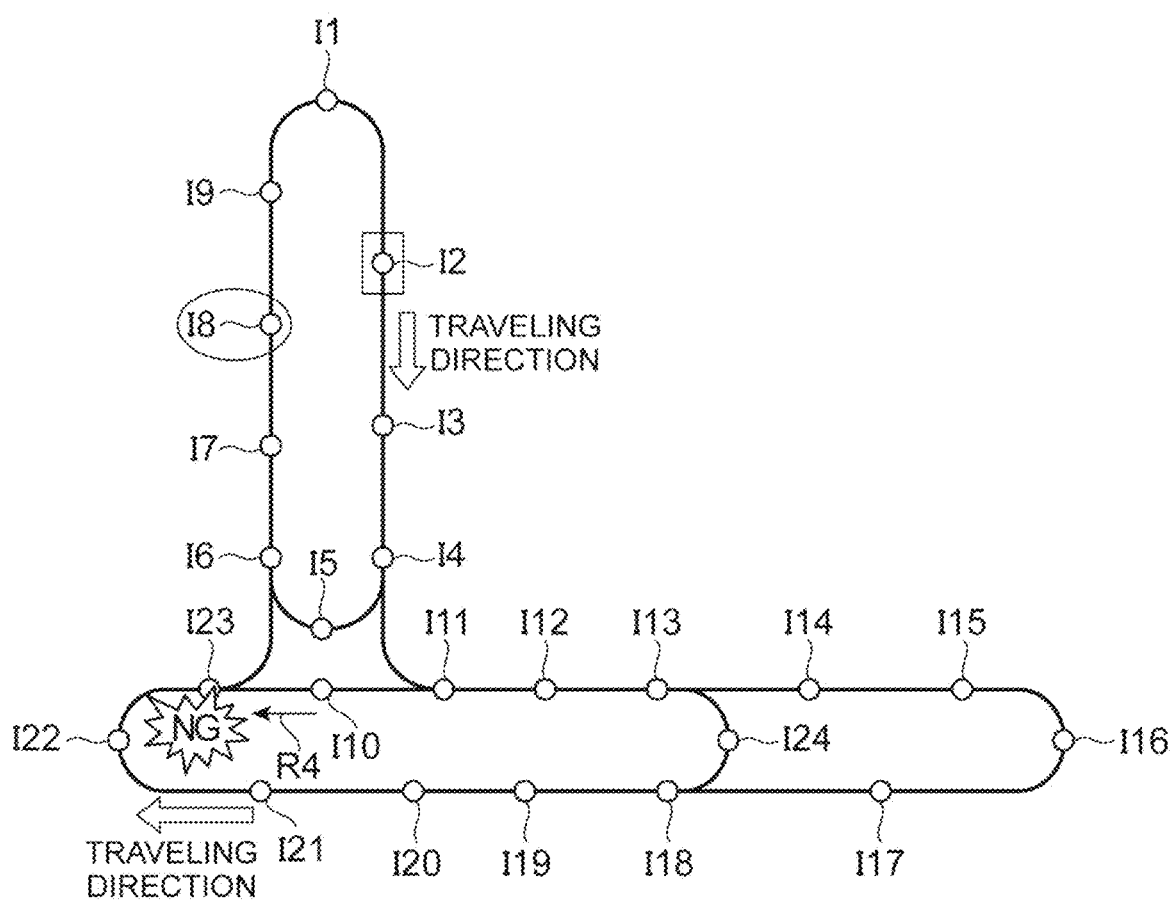
FIG. 11 is a diagram showing a continuation of FIG. 10B.

As shown in FIG. 11, for the route table R4, the route examination is continued, and also costs are added up to calculate the total cost. Thus, the route table R4 of Formula

(18) below is set. Because the route table R4 includes the point mark I23 two times (i.e., includes a point mark that has been already traced), it is determined at this point of time that further examination is not necessary, and the examination is stopped. Subsequently, because unexamined routes have become depleted on the track 2, the empty traveling vehicle 3E of the shortest travel route candidate is set as a first-to-arrive empty traveling vehicle, and the inverse route search processing is completed.

$$R4=I8,I23,I13,I12,I11,I10,I23 \qquad (18)$$

As described above, in the inverse route search processing, the following condition to allow search, the following condition to stop the search, and the following condition to end the search are set, and under these conditions, routes are to be examined.

Condition to allow searching:
when an empty traveling vehicle 3E has been found and the total cost is smaller than the minimum cost
Condition to stop searching:
when returning to the point mark of a destination point P for which examination has been started
when returning to the point mark of a branch point BP that has been already traced
when the total cost exceeds the minimum cost
Condition to end searching:
when unexamined routes have become depleted As described above, in the traveling vehicle controller 4 and the traveling vehicle system 1, if the distance from a branch point BP to the position of an empty traveling vehicle 3E that is traveling is equal or substantially equal to or shorter than the branch-switching impossible distance Z, the branch mechanism is not able to be switched before the branch point BP is reached. Thus, it is determined that this empty traveling vehicle 3E is not able to change at the branch point BP the course direction into which it is scheduled to proceed (the empty traveling vehicle 3E has to proceed at the branch point BP in the course direction in which it is scheduled to proceed), and the post-course-switch travel route is excluded from a plurality of travel route candidates that are provided as references during detection of the first-to-arrive empty traveling vehicle. Thus, a situation in which the empty traveling vehicle 3E to which the transport command has been assigned is not able to change courses at the branch point BP and detours to travel to the destination point P is able to be avoided.

Consequently, in the example of the track layout shown in FIG. 1, the transport command is able to be assigned to, instead of the empty traveling vehicle 3E that has to proceed to the destination point P after traveling one round on the loop travel path 2A, the empty traveling vehicle 3E that is able to reach the destination point P in the shortest time on the loop travel path 2B. The traveling vehicle controller 4 is able to improve the method of selecting a traveling vehicle when assigning the transport command to the optimum empty traveling vehicle 3E. With respect to whether an empty traveling vehicle 3E is able to proceed toward the destination point P at a branch point BP and based on the positional relation between the empty traveling vehicle 3E and the destination point P, the transport command is able to be assigned to an empty traveling vehicle 3E that is able to reach the destination point P first. Accordingly, an empty traveling vehicle 3E is able to quickly reach the destination point P.

In the traveling vehicle controller 4 and the traveling vehicle system 1, when an empty traveling vehicle 3E traveling toward a branch point BP on the track 2 is located within a range of a branch-switching impossible distance Z from the branch point BP and is scheduled to proceed toward a main way at the branch point BP, the pseudo-shift processing is performed. By the pseudo-shift processing, this empty traveling vehicle 3E is able to be determined to be located downstream of the branch point BP and on the side of the main way. Thus, the post-course-switch travel route is excluded from the travel route candidates. Thus, a situation in which the empty traveling vehicle 3E to which the transport command has been assigned is not able to change courses at the branch point BP and detours to travel to the destination point P is able to be avoided.

The traveling vehicle controller 4 and the traveling vehicle system 1 perform the inverse route search processing of searching for a shortest travel route candidate that is a travel route candidate the total cost of which is smallest and detecting as a first-to-arrive empty traveling vehicle an empty traveling vehicle 3E corresponding to the shortest travel route candidate thus searched for. Thus, the first-to-arrive empty traveling vehicle is able to be accurately detected.

If the distance between the pseudo-position of an empty traveling vehicle 3E subjected to the pseudo-shift processing and the actual position thereof is longer, another empty traveling vehicle 3E is more likely to exist therebetween. In this case, even though the other empty traveling vehicle 3E is able to reach the destination point P first, the empty traveling vehicle 3E subjected to the pseudo-shift processing has been recognized to be located in the pseudo-position, and thus there is a possibility that the command is assigned to the empty traveling vehicle 3E subjected to the pseudo-shift processing. Accordingly, in the pseudo-shift processing of the traveling vehicle controller 4 and the traveling vehicle system 1, the empty traveling vehicle 3E is determined to be located downstream of the branch point BP and within the distance range K equal or substantially equal to or shorter than the vehicle length of the empty traveling vehicle 3E from the branch point BP. This eliminates the possibility that another empty traveling vehicle 3E exists between the pseudo-position of the empty traveling vehicle 3E subjected to the pseudo-shift processing and the actual position thereof. Accordingly, a situation in which the transport command is assigned to the empty traveling vehicle 3E subjected to the pseudo-shift processing is able to be avoided, because the pseudo-shift processing has been performed thereon although the transport command should be originally assigned to the other empty traveling vehicle 3E.

In order to reliably change courses of an empty traveling vehicle 3E at a branch point BP, the branch-switching impossible distance Z being upstream from the branch point BP tends to increase as the vehicle speed of the empty traveling vehicle 3E increases. Accordingly, in the traveling vehicle controller 4 and the traveling vehicle system 1, the branch-switching impossible distance Z is set to increase continuously or stepwise as the vehicle speed of the empty traveling vehicle 3E increases. Thus, the branch-switching impossible distance Z is able to be set according to this tendency.

In the traveling vehicle controller 4 and the traveling vehicle system 1, the inverse route search processing includes: the first process of examining routes on the track 2 to trace them from the destination point P in a direction opposite to the traveling direction of each empty traveling vehicle 3E, thereby searching for a travel route candidate; the second process of setting the travel route candidate searched for in the first process as a shortest travel route candidate, and also setting the total cost of this travel route candidates as a minimum cost; the third process of examining routes on the track 2 to trace them from the destination point P in a direction opposite to the traveling direction of each empty traveling vehicle 3E, thereby searching for a travel route candidate the total cost of which is smaller than the minimum cost; the fourth process of setting the travel route candidate searched for in the third process as a shortest travel route candidate, and also setting the total cost of this travel route candidate as a minimum cost, and then returning to the third process; and the fifth process of ending the processing if a travel route candidate is not able to be searched for in the third process and unexamined routes have become depleted on the track 2. Thus, the inverse route search processing is able to be specifically and effectively performed.

Although preferred embodiments of the present invention have been described above, the present invention is not limited to the preferred embodiments described above, and various modifications may be implemented within a scope of the present invention.

In the above-described preferred embodiments, when the pseudo-shift processing is performed, the command assignment controller 44 may add a correction cost corresponding to the period of time for an empty traveling vehicle 3E subjected to the pseudo-shift processing to travel between the pseudo-position of the empty traveling vehicle 3E and the actual position thereof to the total cost of the route table of the empty traveling vehicle 3E in the inverse route search processing (the period of time calculated for the travel route candidate corresponding to the empty traveling vehicle 3E).

Figure 12:
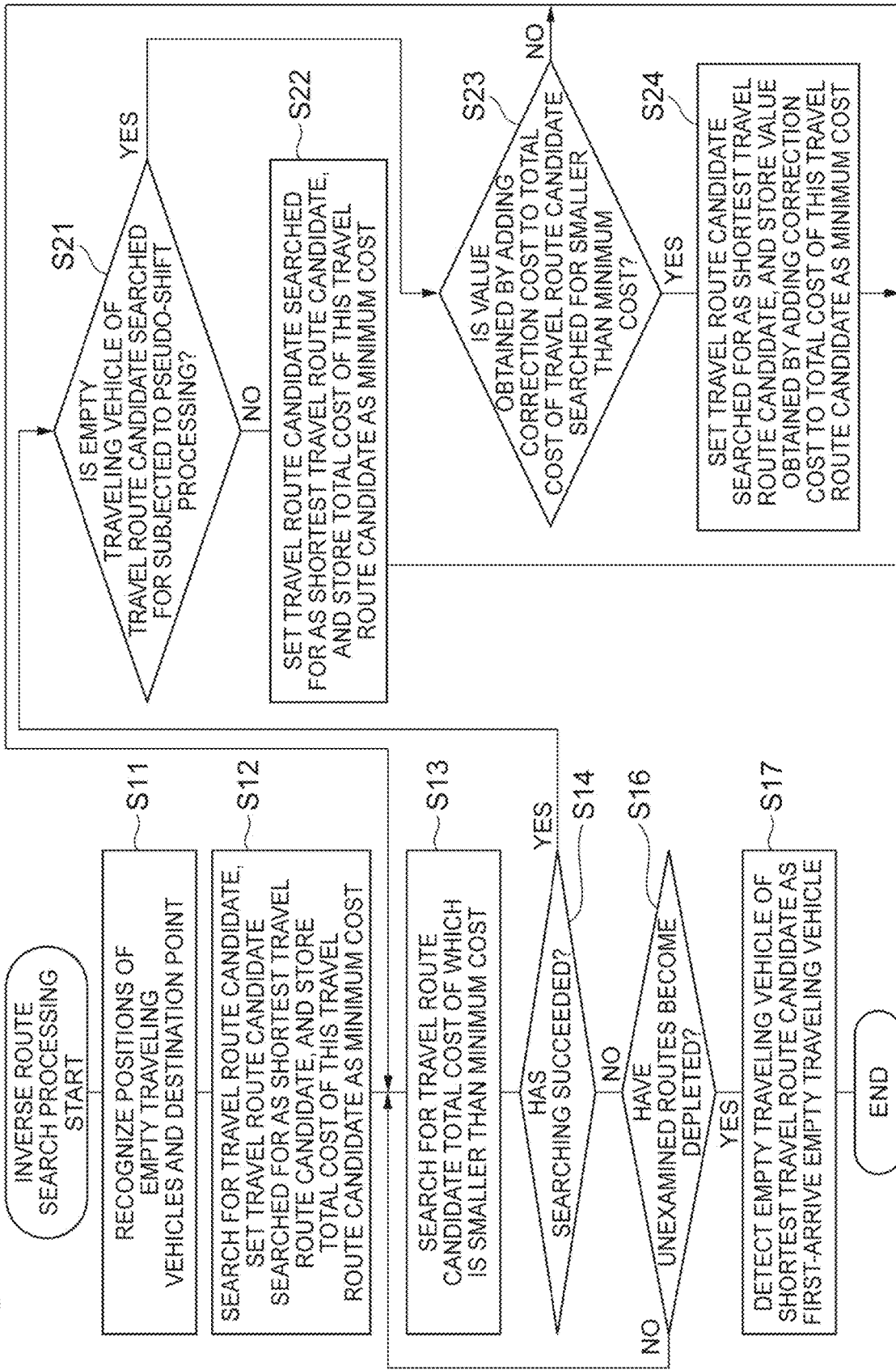
FIG. 12 is a flowchart showing inverse route search processing according to a modification according to a preferred embodiment of the present invention.

For example, as shown in FIG. 12, in the inverse route search processing, if YES at step S14 above, whether the empty traveling vehicle 3E of the travel route candidate search for is subjected to the pseudo-shift processing is determined (step S21). If NO at step S21 above, the travel route candidate searched for is set as the shortest travel route candidate, and also the total cost of this travel route candidate is set as the minimum cost to be stored in the traveling vehicle controller 4 (step S22). Subsequently, the processing returns to the process of step S13 above.

If YES at step S21 above, whether a value determined by adding the correction cost to the total cost of the travel route candidate searched for is smaller than the minimum cost is determined (step S23). If YES at step S23 above, the travel route candidate searched for is set as the shortest travel route candidate, and the value determined by adding the correction cost to the total cost of this travel route candidates is set as the minimum cost to be stored in the traveling vehicle controller 4 (step S24). Subsequently, the processing returns to the process of step S13 above. If NO at step S23 above, the processing returns to the process of step S13 above. Herein, the correction cost may be calculated when the pseudo-shift processing is performed, and may be stored in the traveling vehicle controller 4.

By this addition of the correction cost, the total cost of the route table of the empty traveling vehicle 3E subjected to the pseudo-shift processing is able to be corrected. Accordingly, while determining that the empty traveling vehicle 3E is located downstream of the branch point BP, the total cost in the inverse route search processing is able to be calculated based on the positional relation between the actual position of the empty traveling vehicle 3E and the destination point P.

In the above-described preferred embodiments, the traveling vehicle controller 4 performs the pseudo-shift processing, thus consequently excluding the post-course-switch travel route from the travel route candidates that are provided as references during detection of the first-to-arrive empty traveling vehicle. However, the present invention is not limited to this specific implementation. The traveling vehicle controller 4 may, without performing the pseudo-shift processing, estimate routes based on traveling information of the empty traveling vehicles 3E and directly exclude the post-course-switch travel route from the travel route candidates that are provided as references during detection of the first-to-arrive empty traveling vehicle. For example, based on the actual position, the vehicle speed, and the travel schedule route of each empty traveling vehicle 3E, route examination in the inverse route search processing may be performed with a route table corresponding to the post-course-switch travel route being excluded.

Although costs or total costs are included in the above-described preferred embodiments, the present invention is not limited to this specific implementation. For example, route distances may be included. Other various parameters may be included to define a period of time for each traveling vehicle 3 to travel.

Track layouts in the above-described preferred embodiments are not limited to the examples in FIG. 1, and FIGS. 7A and 7B to FIG. 11, and various track layouts may be provided. The preferred embodiments described above has been described in which the traveling vehicles 3 are overhead traveling vehicles as one example. However, other examples of the traveling vehicles include automated guided traveling vehicles and stacker cranes that travel on a track installed on the ground or abutments.

In the above-described preferred embodiments, in the inverse route search processing, when routes are examined to be traced from the destination point P on the track 2 in a direction opposite to the traveling direction, when an empty traveling vehicle 3E has been found for the first time (in the case of the first finding of the empty traveling vehicle 3E), and if this empty traveling vehicle 3E is traveling toward a branch point BP on the track 2, is located within the range of the branch-switching impossible distance Z from the branch point BP, and is scheduled to proceed toward the main way at the branch point BP, this finding may be ignored. By this process, the post-course-switch travel route is excluded from the travel route candidates, and thus a situation in which the empty traveling vehicle 3E to which the transport command is assigned detours to travel to the destination point P is able to be avoided, and an empty traveling vehicle 3E is able to be controlled to quickly reach the destination point P.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle controller to assign, to any one of a plurality of traveling vehicles that each travels on a travel path including a branch point, a command to travel to a destination point on the travel path, the traveling vehicle controller comprising:

a command assignment controller configured or programmed to detect a first-to-arrive traveling vehicle that is able to reach the destination point first among the plurality of traveling vehicles, based on travel route candidates on which the plurality of traveling vehicles travel along the travel path from respective positions to reach the destination point, and to assign the command to the first-to-arrive traveling vehicle to cause the first-to-arrive traveling vehicle to travel to the destination point based on the command; wherein during detection of the first-to-arrive traveling vehicle, when one of the plurality of traveling vehicles traveling toward the branch point on the travel path is located within a range of a branch-switching impossible distance from the branch point, which corresponds to a shortest distance from the branch point at which the one of the plurality of traveling vehicles is able to switch course, and is scheduled to proceed toward a main way at the branch point, the command assignment controller is configured or programmed to perform pseudo-shift processing by which an actual position of the one of the plurality of traveling vehicles upstream of the branch point is determined to be virtually located in a pseudo-position downstream of the branch point and on a side of the main way.

2. The traveling vehicle controller according to claim 1, wherein the command assignment controller is configured or programmed to:

calculate, for each of the travel route candidates, a period of time for each of the plurality of traveling vehicles to travel thereon; and detect, as the first-to-arrive traveling vehicle, a traveling vehicle corresponding to a travel route candidate on which the period of time is shortest.

3. The traveling vehicle controller according to claim 2, wherein, after performing the pseudo-shift processing, the command assignment controller is configured or programmed to add a period of time to travel between the pseudo-position of the one of the plurality of traveling vehicles subjected to the pseudo-shift processing and the actual position of the one of the plurality of traveling vehicles to the period of time calculated for the travel route candidate corresponding to the traveling vehicle.

4. The traveling vehicle controller corresponding to claim 1, wherein, in the pseudo-shift processing, the command assignment controller is configured or programmed to determine the one of the plurality of traveling vehicles to be located downstream of the branch point and within a distance range equal or substantially equal to or shorter than a vehicle length of the one of the plurality of raveling vehicles from the branch point.

5. The traveling vehicle controller according to claim 1, wherein the branch-switching impossible distance is set to increase continuously or stepwise as a vehicle speed of the one of the plurality of traveling vehicles increases.

6. A traveling vehicle controller to assign, to any one of a plurality of traveling vehicles that each travels on a travel path including a branch point, a command to travel to a destination point on the travel path, the traveling vehicle controller comprising:

a command assignment controller configured or programmed to detect a first-to-arrive traveling vehicle that is able to reach the destination point first among the plurality of traveling vehicles, based on travel route candidates on which the plurality of traveling vehicles travel along the travel path from respective positions to reach the destination point, and to assign the command to the first-to-arrive traveling vehicle to cause the first-to-arrive traveling vehicle to travel to the destination point based on the command; wherein during detection of the first-to-arrive traveling vehicle, in a case when one of the plurality of traveling vehicles traveling toward the branch point on the travel path is located within a range of a branch-switching impossible distance from the branch point, which corresponds to a shortest distance from the branch point at which the one of the plurality of traveling vehicles is able to switch course, and is scheduled to travel toward a main way at the branch point, the command assignment controller is configured or programmed to exclude, from the travel route candidates, a post-course-switch travel route on which the one of the plurality of traveling vehicles proceeds toward a branch way when passing through the branch point first after the moment of the case as a starting point.

7. A traveling vehicle system comprising:

a travel path including a branch point;

a plurality of traveling vehicles that each travels along the travel path; and the traveling vehicle controller according to claim 1.

8. The traveling vehicle controller according to claim 2, wherein the branch-switching impossible distance is set to increase continuously or stepwise as a vehicle speed of the one of the plurality of traveling vehicles increases.

9. The traveling vehicle controller according to claim 3, wherein the branch-switching impossible distance is set to increase continuously or stepwise as a vehicle speed of the one of the plurality of traveling vehicles increases.

10. The traveling vehicle controller according to claim 4, wherein the branch-switching impossible distance is set to increase continuously or stepwise as a vehicle speed of the one of the plurality of traveling vehicles increases.

* * * * *